Jan. 9, 1968 L. C. WHITE 3,362,856

SILICON TRANSISTOR DEVICE

Original Filed Nov. 13, 1961

INVENTOR
LORING C. WHITE

BY
Wolf, Greenfield + Hieken

United States Patent Office 3,362,856
Patented Jan. 9, 1968

3,362,856

SILICON TRANSISTOR DEVICE

Loring C. White, Reading, Mass., assignor to Transitron Electronic Corp., Wakefield, Mass., a corporation of Massachusetts Original application Nov. 13, 1961, Ser. No. 151,870, now Patent No. 3,194,699, dated July 13, 1965. Divided and this application Dec. 22, 1964, Ser. No. 420,284
1 Claim. (Cl. 148—33.5)

ABSTRACT OF THE DISCLOSURE

A silicon body has a collector layer doped with an N type impurity, a base layer doped with a P-type impurity having a relatively low diffusion coefficient and comprising preferably gallium or bromium and an emitter layer doped with an N type impurity. Both the base layer and the emitter layer also include a P-type impurity, such as aluminum, that diffuses at a faster rate than the first-mentioned P-type impurity such as gallium in the base layer. There is also an external base region containing the second-mentioned P-type impurity that establishes a low resistance path between the internal base layer and the device surface.

This divisional application discloses and claims only subject matter disclosed in the copending application of Loring C. White, entitled Method of Making Semiconductive Devices, Ser. No. 151,870, filed Nov. 13, 1961, now Patent No. 3,194,699.

The present invention relates to a means and method of manufacturing or fabricating junction transistors and more particularly the present invention relates to an improved means and method of forming a base and base contact in junction transistors.

Heretofore there have been substantial problems in making ideally low resistance contacts to the base of junction transistors. If the resistance of the base layer of the transistor is lowered for this purpose, there is a corresponding increase in the conductivity of the base layer. This increased conductivity results in a reduced base life time and current gain. Consequently in methods heretofore practiced in the manufacture of NPN transistors, the base layer resistivities have been limited to a range of approximately $10^{17}$ to $10^{18}$ carriers per cubic centimeter. If the conductivity is increased above this general range of carrier densities, it is practical to do so only in very narrow base widths in such a manner as to compensate for resulting deterioration of base life time. This in turn presents a very small area in which a contact may be made. Thus in present practice relatively high resistance base layers are utilized and relatively elaborate means are used for contacting the base region in an area external of the emitter. For example, evaporated ring structures such as being used on NPN types 2N696 and 2N697 transistors have been used. In such specific structures the rings are spaced as closely to the emitter periphery as possible to minimize base resistance.

The present invention provides a means and method of forming base contacts which overcome the problems set forth above and which in addition provide an improved technique having added advantages.

In the present invention that portion of the base layer not immediately beneath the emitter layer, hereafter referred to as the external base layer, is formed with a low resistivity substantially independent of the resistivity of that portion of the base layer immediately below the emitter layer and hereafter referred to as the internal base layer. In the present invention P or N type external base layers may be formed with resistivities having as much as $10^{19}$ carriers per cubic centimeter.

In ring structures of the prior art referred to above there was a finite distance between the emitter layer and the base contact ring, thus adding to the overall resistivity of the base layer. In the present invention, however, the contact region of the base layer, comprising the external base, extends into immediate contact with the emitter, thereby largely eliminating the increased base resistance caused by the spacing of the base contact and emitter layer in earlier art. Because of this further decrease in resistance caused by the increase in external base layer conductivity, single point contacts of the contact region or external base layer are possible on most power transistors. This technique may be used with a modified compression bonding technique to silicon power transistors.

It is a further object of the present invention to provide a means and method of controlling the doping level and base resistivities of the external base layer independent of the internal base layer. The present invention also discloses a novel method for the establishment of an internal base layer of different width than the external base width. Moreover the thickness of the internal base layer can be minimized to provide improved current gain. In addition a means and method are taught for doping the external base layer in a manner relatively independent of the internal base doping which thereby minimizes the widening of the internal base and therefore maintains a higher gain in the internal base layer.

The present invention is also easily adapted for commercial production and permits the manufacture of transistors of greater reliability, higher gain at low currents, more uniform and higher voltage breakdown parameters, B vs. $I_c$, $R_b$, etc., marked reductions of input voltage, VBE, improved base lifetime, and reduction in collector saturation resistance (when limited by base resistance).

In addition to these advantages, the present invention permits the establishment of a surface field condition such as to reduce the noise level attributed to surface etching. The "post diffusion" technique herein described creates a voltage field which forces carriers towards the internal base from the exposed surface of the external base layer. This raises low current gain and reduces noise significantly by keeping carriers away from the base surface and, therefore, from recombination with carriers on the surface which is a source of noise generation.

In addition the effect of surface imperfections are minimized in the present invention since "post diffusion" can be effected to a sufficient depth to minimize the effect of surface defects. This in turn means that transistors prepared in accordance with the present invention do not require the same degree of care in surface preparation as those heretofore made since the effect of these imperfections may be eliminated by "post diffusing" to greater depth.

These and other objects and advantages of the present invention can be more clearly understood from a consideration of the accompanying drawings, in which.

Figure 1:
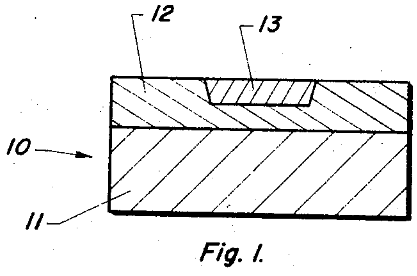
FIGS. 1 and 2 are cross sectional schematic elevations of multiple layer semiconductive bodies illustrating successive steps in the process of the present invention.

The process of the present invention may be used to manufacture silicon NPN and PNP transistors and may also be applied to PNPN and PNIP multijunction devices of any semiconductive material. However, for purposes of clarity a preferred method of making an NPN silicon transistor will be initially described in connection with FIGS. 1–3.

A silicon body 10 is formed with multiple layers 11, 12 and 13 by known suitable means. Layer 11 is doped with an N-type impurity to form a collective layer, layer 12 is doped with a P-type impurity, preferably having a relatively low diffusion coefficient and comprising preferably gallium or boron to form a base layer while layer 13 is doped with an N-type impurity to form an emitter layer. These layers may be formed by any of several well known processes. For example, a parent body of N-type doped silicon may be formed by a temperature gradient zone melting technique described by Pfann in United States Letters Patent No. 2,813,048. The surface of the prepared parent silicon body may then be polished by conventional processes for vapor diffusion. A quantity of P-type impurities may then be vapor diffused onto the polished surface of the parent silicon body to form layer 12 in junction relation to collector layer 11. The surface of layer 12 is then oxide masked except over a selected area in which the emitter layer is to be formed in a well-known manner. This may be accomplished by coating the entire surface 12 with a nonporous oxide film and then removing the film by etching from the selected area. Subsequently a second vapor diffusion of an N-type or acceptor impurity over the selected area of the outer surface of layer 12 creates the emitter layer 13. After this second diffusion, forming emitter layer 13, the oxide mask may be removed by suitable and known means. Preferably this oxide mask is etched from the surface with a suitable etchant such as hydrofluoric acid. After the emitter layer 13 is formed and the oxide layer removed, the semiconductor body is subjected to a subsequent or "post diffusion" operation in which an impurity of the same type as the base region 12, in this case P-type, is allowed to diffuse into the base. The impurity selected has a greater impurity level than the impurity originally contained in layer 12. In the instant, and in most cases, aluminum is the preferred dopant for the "post diffusion" operation for NPN transistors.

It is important in the preferred embodiment of the invention to select a P-type impurity in the manufacture of an NPN silicon transistor for the "post diffusion" step having a diffusion coefficient such that it will diffuse at a faster rate than the P-type impurity originally contained in layer 12. The external base layer will thereby contain a predominating P-type impurity having a diffusion coefficient greater than the diffusion coefficient of the P-type impurity predominating in the internal base layer region. Thus, where gallium is used for originally doping base layer 12, the "post diffusion" dopant may be aluminum. Where boron is used as the original dopant to dope the base layer 12, aluminum or gallium may be used in the "post diffusion" step, to dope the external base region. While using dopants having a greater diffusion coefficient for the "post diffusion" step than the original dopant in the base layer is preferable, it has been found that the same dopants may also be used although the results are not as good. Where a single dopant is used, not much dope can be diffused into the external base region without widening the internal base and thereby reducing gain.

The base layer 12 after initial doping normally has $5\times10^{17}$ ($\pm50\%$) carriers per cubic centimeter. The emitter layer 13 before "post diffusion" has between $10^{19}$ and $10^{21}$ carriers per cubic centimeter. The emitter layer 13, however, is normally always more heavily doped than the base region 12 by an exponential factor. During the "post diffusion" operation the P-type impurity material referred to above in an inert carrier gas is diffused in carrier concentration onto the surface of the base layer 12 and emitter layer 13 in the amount of $10^{19}$ ($\pm50\%$). This post diffusion dopant is not sufficient strong to affect the more heavily doped emitter layer 13 or the remote internal base region 16. The post diffusion dopant, however, does diffuse into the relatively lightly doped and exposed external base region 17 on the surface to a depth indicated at 18. Thus, in the body illustrated in FIG. 2 subsequent to the "post diffusion" operation or step, post diffused external base layer 19 has a carrier concentration of $10^{19}$ carriers per cubic centimeter, the emitter layer 13 is substantially unchanged from its original carrier concentration of $10^{20}$ and the internal base region 16 has a carrier concentration of $10^{17}$ or $10^{18}$ carriers per cubic centimeter, which is substantially unaffected by the "post diffusion" operation.

The foregoing figures for the carrier levels are exemplary and of course may be varied. However, the carriers diffused into the external base should not be of such concentration as to change the type of the emitter. Preferably the "post diffusion" of the external base portion should not raise the external base carrier level to more than one-half the carrier level in the emitter layer. Thus, if the emitter layer prior to the "post diffusion" step had an N-type carrier level of $10^{19}$ carriers per cubic centimeter, the external base surface would be doped in a "post diffusion" step to a P-type carrier level of no more than $5\times10^{18}$ carrier per cubic centimeters. Further doping may cause a skin effect on the emitter layer which would have to be removed by etching. When the "post diffusion" step is completed there is slight compensation on the surface of the emitter layer 13, but the layer 13 does not change from N to P type because of the relative levels of doping. In addition, the effect is such as to compensate only a limited area of the surface of the emitter layer away from the relevant junction of the emitter and base.

Figure 2:
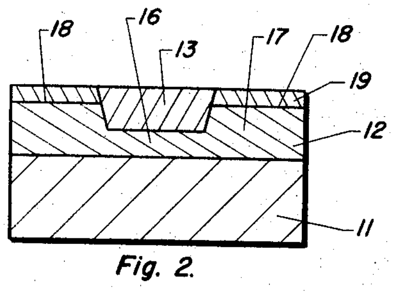

In terms of relative thickness of the various layers referred to in FIGS. 1 and 2, a wide selection of combinations is possible in accordance with accepted transistor fabrication techniques. Thus, for example, the collector layer 11 may have a thickness of 0.5 to 10 mils. The external base layer 17 may have a thickness of between .2 and 3 mils, the emitter layer 13 may have a thickness of between .05 and 0.1 mil, while the internal base region 16 may have a thickness of between $.04\pm0.03$ mil. These parameters are preferable for a small signal low noise amplifier transistor.

Differences in the external and internal base regions may be controlled by varying the "post diffusion" time and temperature to thereby control resistivity and if desired to minimize effects of surface defects. The depth of doping will also determine the field conditions which minimize surface recombination and therefore minimize noise generation. In addition an ideal field condition concentrates the carriers in the internal base region and therefor current gain may be increased. This is particularly noticeable at low current levels of operation. The "post diffusion" step has particular advantages in minimizing the adverse field condition effects in an NPN transistor caused by unsatisfactory etching. In such devices it is normal to find an electric field established by the graded base doping at the emitter and base interface region with the field increasing toward the upper surface of the base layer. The strength of this field is determined by the impurity doping level and gradient. This means that electrons are attached to the surface because the field described is counteraffected by a stonger field of the opposite direction induced by surface charges. It is at this point that electrons are attracted to the surface and lost. The "post diffusion" technique creates such a strong initial field that the counterfield due to the surface charges is minimized. The field condition established by "post diffusion" may be vectorially added to the field condition originally established during the initial doping procedure. Thus by doping in such a manner as to counteract the field conditions due to surface charges, a beneficial field condition may be established.

Following the formation of the junctions as described above, conventional techniques may be utilized to fabricate the ohmic connections to the individual transistor layers in which connections such as illustrated at 27, 28 and 29 may be made.

The foregoing process may also be utilized in connection with the manufacture of PNP transistors. However, in this case the base layer 12 is initially doped with a suitable dopant from Group V of the Periodic Table, such as arsenic and then in the "post diffusion" step is doped with a suitable dopant having a greater diffusion coefficient such as phosphorous. Although the foregoing description in connection with the manufacture of NPN and PNP transistors contemplates vapor diffusion, in each doping step, including the "post diffusion" step, solid diffusion is also possible.

In the fabrication of silicon transistors utilizing aluminum as an initial dopant, an oxide masking technique cannot be used. Under such conditions, an alternate method should be practiced which does not make use of an oxide masking technique.

Such technique is illustrated in FIGS. 4–7. While this modification is particularly useful in connection with the use of aluminum as a dopant for the internal base region, it may also be used for other dopants. In this process a three-layer silicon body 50 is formed with a collector layer 51, base layer 52 and emitter layer 53 by a suitable process which may comprise for example a zone melting technique of the type described or referred to in U.S. Letters Patent No. 2,813,048, issued Nov 12, 1957, to Pfann. For convenience we may assume that the collector and emitter layers 51 and 53 respectively are doped with an N type dopant while the base layer 52 is doped with a P type impurity, of the types and to the same levels as referred to in connection with the embodiment of the invention described on connection with FIGS. 1–3. After the semiconductive body 50 is formed, the emitter layer 53 is delineated to form a body having transverse measurements less than the collector body. This may be done by a wax masking and etching technique. Here the silicon body 50 is partially masked by a wax or photosensitive lacquer film 67 over layer 53 in a geometry conforming to the desired emitter layer, to make the masked portion of the upper surface of the layer 53 etch resistant. A suitable masking wax comprises a commercially available wax known as Apiezon "W" wax, made by Metropolitan Vickers Electrical Co., Ltd., diluted with a little trichloroethylene to a consistency suitable for spraying. If desired, the wax may be applied through a metal screen formed with holes corresponding to the desired etch pattern so that multiple areas may be etched simultaneously. If a photosensitive lacquer is desired, a "Kodak" metal etch resist may be used in a manner similar to that of the wax. In addition to a wax and photoresist technique, a silk screen technique may also be used for masking the emitter region of the semiconductor body. In this technique a silk screen fabricated by well-known techniques is formed with holes conforming to the desired pattern. A suitable wax resist material which may comprise a wax such as the Apiezon "W" wax referred to above may be mixed in a 3:1 weight ratio with a solvent such Turposol No. 3, made by Hercules Powder Company.

Figure 5:
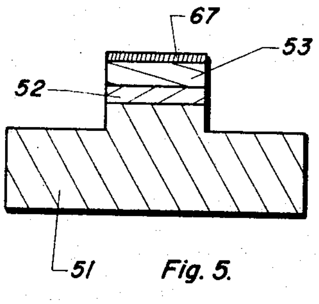
Figure 6:
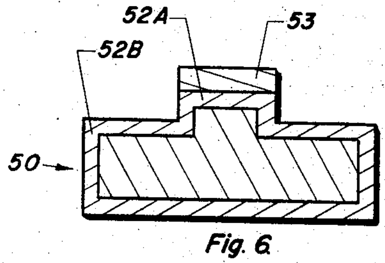

After the emitter layer has been masked, the unmasked portion of layer 53 are etched away by a suitable etchant such as a nitric acid hydrofluoric acid combination. Normally the etchant will also remove portions of layer 52 not directly under the masked portion of layer 53. The resultant etched body has a "mesa" configuration as illustrated in FIG. 5, in which the collector layer 51 forms a platform supporting the base layer 52 and emitter layer 53. The masking material is then removed with a suitable wax solvent.

Following the cleaning of the etched body, it is subjected to a "post diffusion" step in a manner as described above. In this case, in forming an NPN transistor a dopant such as aluminum may be used and diffused from a vapor phase in a known manner into the silicon body 50. The dopant will uniformly diffuse into both the emitter and the collector 51. Since the collector carrier level is lower than the level of the "post diffusion" carriers, the surface of the collector layer 51 will be converted to the opposite type, in this case, P type. This surface of P type material is contiguous with the internal base 52A but of lower resistivity and thereby forms the external base layer 52B. However, as the impurity dopant level of the aluminum in the "post diffusion" step is insufficient to substantially offset the resistivity of the emitter layer, its only significant effect is to form the external base region. The internal base layer 52A and the external base layer 52B formed have the resistivity parameters as described above in which internal base layer 52A has high resistivity and external base layer 52B has low resistivity.

Following this "post diffusion" technique, the silicon body 50 may have ohmic contacts 60, 61 and 62 connected to it by suitable and conventional means. Further the sides 64 and bottom 65 may be trimmed to remove from them the layer resulting from the "post diffusion" technique.

Figure 3:
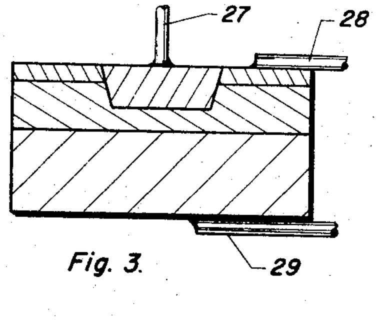
FIG. 3 is a schematic elevation of a junction transistor formed in accordance with the present invention.
Figure 4:
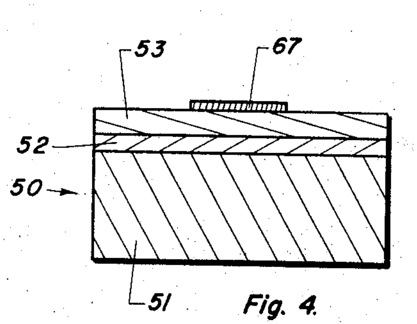
FIGS. 4, 5 and 6 are schematic elevations of multiple layer semiconductive bodies illustrating successive steps in a modification of the present invention.
Figure 7:
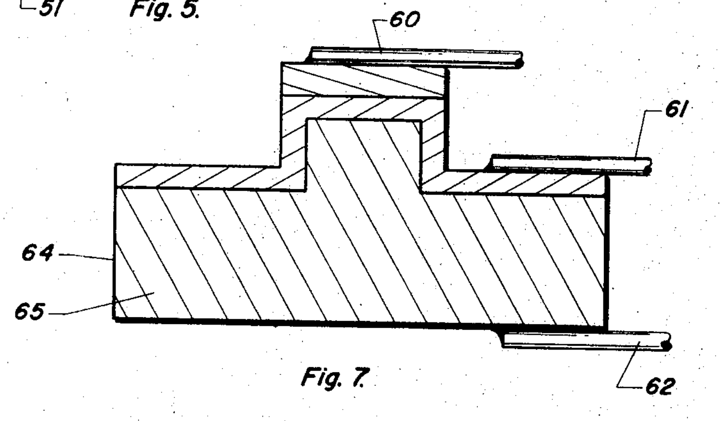
FIG. 7 is a schematic cross sectional elevation of a junction transistor formed in accordance with modified processes illustrated in FIGS. 4–6.

The parameters of the device illustrated in FIG. 7 may be comparable to those of FIG. 3.

The present invention also contemplates the use of ultrasonic cutting in order to form the "mesa" projections illustrated in FIG. 5. Such cutting will of course, eliminate the requirement of wax masking.

Having now described my invention, I claim:

1. A semiconductor device of silicon material comprising, an emitter layer embedded in the surface of a base layer,
   - said base layer having an internal portion having a carrier density substantially less than the emitter layer and having an impurity selected from the group consisting of boron and gallium,
   - said base layer having a surface and external portion surrounding said emitter and internal base layer portion and having a carrier density higher than the internal portion established by doping impurities in the external portion consisting of aluminum and an element selected from the group consisting of boron and gallium,
   - whereby said external portions establishes a low resistance path between said internal portion and said surface,
   - and a third layer, a collector layer, joined to the other surface of the base layer and of the same conductivity type as the emitter layer.

References Cited

UNITED STATES PATENTS

| | | | | |
|---|---|---|---|---|
| 3,079,512 | 2/1963 | Rutz. | | |
| 2,947,923 | 8/1960 | Pardue | 148—332 | X |
| 2,981,874 | 4/1961 | Rutz | 148—33.5 | X |
| 3,001,895 | 9/1961 | Schwartz | 148—33.5 | X |
| 3,006,789 | 10/1961 | Nijland | 148—33.5 | X |
| 3,147,152 | 9/1964 | Mendel | 148—187 | X |
| 3,183,128 | 5/1965 | Leistiko | 148—187 | X |

HYLAND BIZOT, *Primary Examiner.*